United States Patent
Fujioka et al.

(10) Patent No.: US 10,576,716 B2
(45) Date of Patent: Mar. 3, 2020

(54) PROTECTIVE ELEMENT AND METHOD FOR MANUFACTURING DISPLAY DEVICE

(71) Applicant: Japan Display Inc., Tokyo (JP)

(72) Inventors: Takahiro Fujioka, Tokyo (JP); Kazuhiro Odaka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/825,176

(22) Filed: Nov. 29, 2017

(65) Prior Publication Data
US 2018/0178493 A1    Jun. 28, 2018

(30) Foreign Application Priority Data

Dec. 22, 2016   (JP) ................................. 2016-249193

(51) Int. Cl.
| | |
|---|---|
| H01L 27/32 | (2006.01) |
| B32B 27/04 | (2006.01) |
| B23P 19/04 | (2006.01) |
| H05K 1/02 | (2006.01) |
| H05K 5/00 | (2006.01) |
| H01L 51/00 | (2006.01) |

(52) U.S. Cl.
CPC .............. *B32B 27/04* (2013.01); *B23P 19/04* (2013.01); *H01L 27/3244* (2013.01); *H01L 51/003* (2013.01); *H05K 1/028* (2013.01); *H05K 5/0017* (2013.01); *B32B 2250/03* (2013.01); *H01L 2227/326* (2013.01); *H05K 2201/05* (2013.01)

(58) Field of Classification Search
CPC ...... H01L 27/32–3279; H01L 51/5246; H05K 2201/10136; H05K 5/0017; B32B 2457/202
See application file for complete search history.

(56) References Cited

U.S. PATENT DOCUMENTS

2018/0108851 A1*   4/2018   Cheng ................. H01L 51/0097

FOREIGN PATENT DOCUMENTS

JP          2011-209405 A    10/2011

* cited by examiner

*Primary Examiner* — Shaun M Campbell
*Assistant Examiner* — Suberr L Chi
(74) *Attorney, Agent, or Firm* — Michael Best & Friedrich LLP

(57) ABSTRACT

A protective element includes a protective film including a first surface and a second surface opposite to the first surface; a first adhesive layer including an adhesive region on the first surface of the protective film; a first release film on the first adhesive layer; a second adhesive layer on the second surface of the protective film; a second release film on the second adhesive layer; a non-adhesive region located to surround the adhesive region, the non-adhesive region including a non-adhesive layer located between the first adhesive layer and the first release film; and a cutting portion located in the non-adhesive region and, as seen in a cross-sectional view, extending from a top surface of the protective film to a bottom surface of the non-adhesive layer.

7 Claims, 16 Drawing Sheets

PROTECTIVE ELEMENT AND METHOD FOR MANUFACTURING DISPLAY DEVICE

CROSS REFERENCE TO RELATED APPLICATIONS

This application is based upon and claims the benefit of priority from the prior Japanese Patent Application No. 2016-249193, filed on Dec. 22, 2016, the entire contents of which are incorporated herein by reference.

FIELD

An embodiment according to the present invention relates to a display device including a foldable flexible substrate.

BACKGROUND

As display devices usable for electric appliances and electronic devices, a liquid crystal display device using an electro-optical effect of a liquid crystal material and an organic EL (electroluminescence) display device including an organic electroluminescence (EL) element have been developed and put into actual products.

Especially, an organic EL element, when being used as a display element, has a feature of realizing a wide viewing angle and highly precise display, and also of being allowed to be located on a flexible substrate. Japanese Laid-Open Patent Publication No. 2011-209405 discloses a display device including a flexible substrate that is foldable at a wiring portion connecting a pixel array portion and a peripheral circuit portion to each other. Such a structure allows a bezel of the display device to be narrower, which decreases the size of the display device.

SUMMARY

An embodiment of the present invention provides a protective element including a protective film including a first surface and a second surface opposite to the first surface; a first adhesive layer including an adhesive region on the first surface of the protective film; a first release film on the first adhesive layer; a second adhesive layer on the second surface of the protective film; a second release film on the second adhesive layer; a non-adhesive region located to surround the adhesive region, the non-adhesive region including a non-adhesive layer located between the first adhesive layer and the first release film; and a cutting portion located in the non-adhesive region and, as seen in a cross-sectional view, extending from a top surface of the protective film to a bottom surface of the non-adhesive layer.

An embodiment of the present invention provides a display device a foldable substrate having a display region and a peripheral region provided thereon; a first protective film on a first surface of the substrate, the first protective film facing the display region; a second protective film on the first surface of the substrate, the second protective film facing the peripheral region; and a protective layer on the display region. The first protective film and the second protective film, and the first surface of the substrate, are pasted to each other via an adhesive layer, the substrate includes a foldable portion, the first protective film and the second protective film are away from each other while having the foldable portion therebetween, a first non-adhesive layer is provided to surround the display region, a second non-adhesive layer is provided to surround the peripheral region, and the first non-adhesive layer and the second non-adhesive layer are between the first surface of the substrate and the adhesive layer.

DESCRIPTION OF EMBODIMENTS

Figure 1:
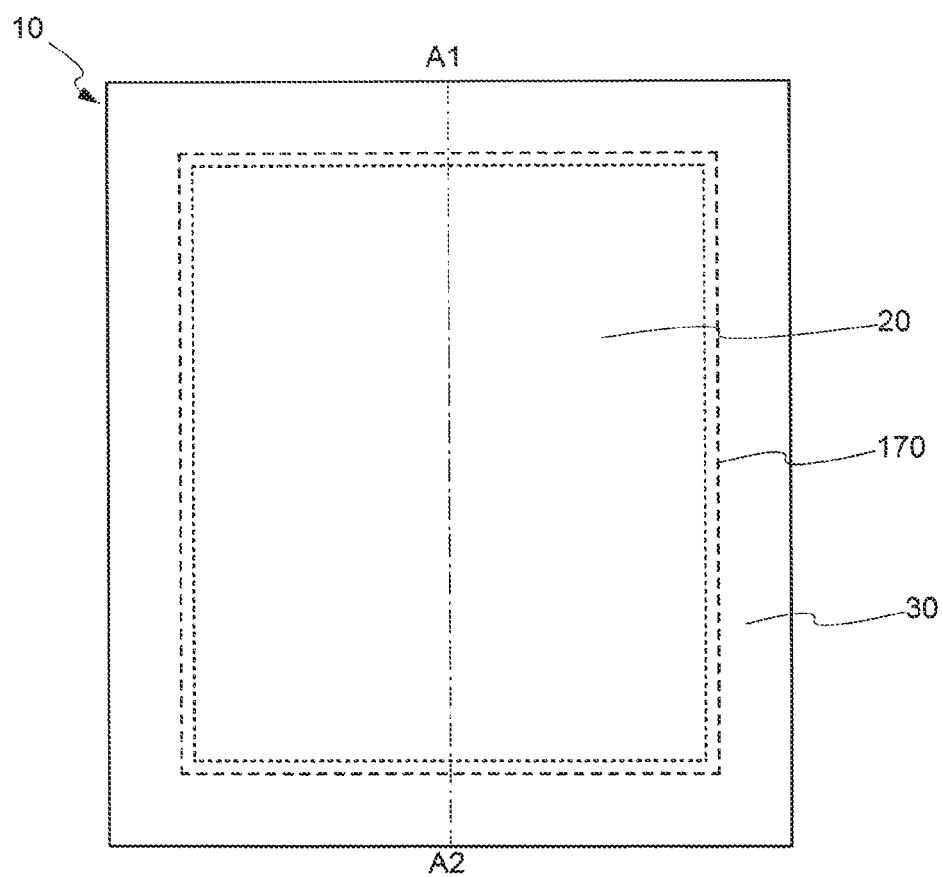
FIG. 1 is a plan view showing a structure of a protective element in an embodiment according to the present invention.

Hereinafter, embodiments according to the present invention will be described with reference to the drawings. This disclosure merely provides an example, and modifications or alterations thereof readily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clearer illustration. The drawings are merely examples and do not limit the interpretations of the present invention in any way.

In the specification and the drawings, components that have substantially the same functions as those described before with reference to a previous drawing(s) bear the identical reference signs thereto, and detailed descriptions thereof may be omitted. The words "first", "second" or the like provided for components are used merely to distinguish the components from each other, and do not have any further meaning unless otherwise specified.

In the specification and the claims, an expression that a component or a region is "on" another component or region encompasses a case where such a component or region is in direct contact with the another component or region and also a case where such a component is above or below the another component or region, namely, a case where still another component or region is provided between such a component or region and the another component or region, unless otherwise specified. In the following description, unless otherwise specified, the side on which a display element is provided with respect to a substrate as seen in a cross-sectional view will be referred to as "above" or "front surface", and the opposite side will be referred to as "below" or "rear surface".

A display device including a flexible substrate may be manufactured as follows. In a protective film that is to be provided on a rear surface of the substrate, a slit-like opening is formed at a position corresponding to a foldable position of the substrate. Then, the protective film is pasted to the rear surface of the substrate. This improves the foldability of the foldable position. In addition, since the slit-like opening is formed in the protective film before the protective film is pasted to the rear surface, the entirety of the protective film is pasted to the substrate without being divided. This makes the manufacturing process more efficient. However, the flexible substrate is thinner than a conventional non-flexible substrate. Therefore, at the time of pasting the protective film, a step formed by the slit-like opening may cause concentration of a stress on lines on the flexible substrate, which may cause breakage of the lines.

Embodiment 1

FIG. 1 is a plan view of a protective element 10 in an embodiment according to the present invention.
(1. Structure of the Protective Element)

As shown in FIG. 1, the protective element 10 includes an adhesive region 20, a non-adhesive region 30, and a cutting portion 170, as seen in a plan view.

The non-adhesive region 30 is provided to surround the adhesive region 20. The cutting portion 170 is provided to surround the adhesive region 20, and is frame-shaped. The cutting portion 170 is provided on the non-adhesive region 30.

Figure 2:
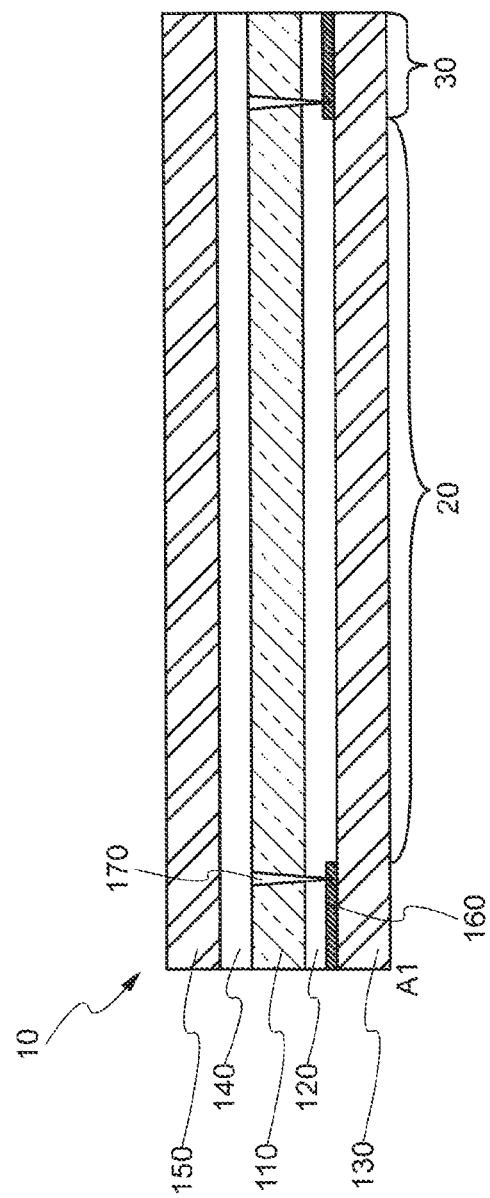
FIG. 2 is a cross-sectional view showing the structure of the protective element in an embodiment according to the present invention.

FIG. 2 is a cross-sectional view of the protective element 10 taken along line A1-A2 provided for the protective element 10 shown in FIG. 1.

As shown in FIG. 2, the protective element 10 includes a protective film 110, a first adhesive layer 120, a first release film 130, a second adhesive layer 140, a second release film 150, and a non-adhesive layer 160. The adhesive region 20 is provided in the first adhesive layer 120.

The protective film 110 is a film having a function of protecting a target of protection. The protective film 110 is formed of an organic resin material. The protective film 110 is formed of, for example, a polyimide-based resin, an acrylic-based resin, an epoxy based resin, a polyethylene terephthalate-based resin, or a silicone-based resin. Alternatively, the protective film 110 may be formed of a metal material such as stainless steel, copper or the like. The protective film 110 may have a thickness sufficient to protect a display device 40, to which the protective film 110 is to be pasted. The thickness of the protective film 110 may be, for example, 100 μm or greater and less than 150 μm.

The first adhesive layer 120 is provided on a first surface (e.g., bottom surface) of the protective film 110. The first adhesive layer 120 has a function of pasting the protective film 110 and a part of the target of protection to each other. The first adhesive layer 120 is formed of an organic resin. The organic resin usable for the first adhesive layer 120 is thermoplastic, thermosetting or photocurable. The first adhesive layer 120 is formed of, for example, a polyimide-based resin, an acrylic-based resin, an epoxy based resin, a polymethacrylate-based resin, a melamine-based resin, a vinyl chloride-based resin, or a silicone-based resin.

The first release film 130 is provided on the first adhesive layer 120. The first release film 130 is provided to cover the protective film 110 while the protective film 110 is transported or processed before being pasted to the display device 40. The first release film 130 contains a peel agent at a surface thereof such that the first release film 130 is releasable. The peel agent 130 is formed of, for example, a silicone-based material.

The second adhesive layer 140 is provided on a second surface of the protective film 110 opposite to the first surface (e.g., on a top surface of the protective film 110). The second adhesive layer 140 may be formed of substantially the same material as that of the first adhesive layer 120.

The second release film 150 is provided on the second adhesive layer 140. The second release film 150 may be formed of substantially the same material as that of the first release film 130.

The non-adhesive layer 160 is provided between the first adhesive layer 120 and the first release film 130. The non-adhesive layer 160 has a function of forming the non-adhesive region 30 surrounding the adhesive region 20 shown in FIG. 1. The non-adhesive layer 160 contains a dry oil, an organic resin or an organic solvent. The non-adhesive layer 160 is formed of, for example, varnish, medium ink or the like. The non-adhesive layer 160 may be formed by printing or may be film-like. The non-adhesive layer 160 may be called a "glue killer".

As shown in FIG. 2, the cutting portion 170 also shown in FIG. 1 is provided to extend from the top surface of the protective film 110 to a bottom surface of the non-adhesive layer 160.

Figure 3:
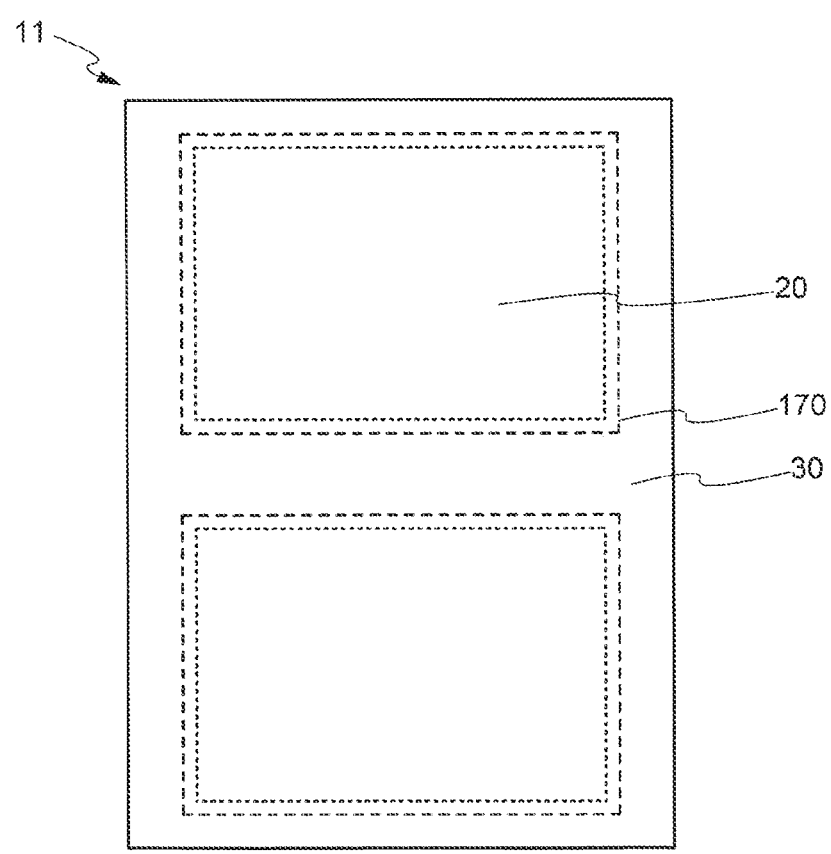
FIG. 3 is a plan view showing a structure of a protective element in an embodiment according to the present invention.
Figure 4:
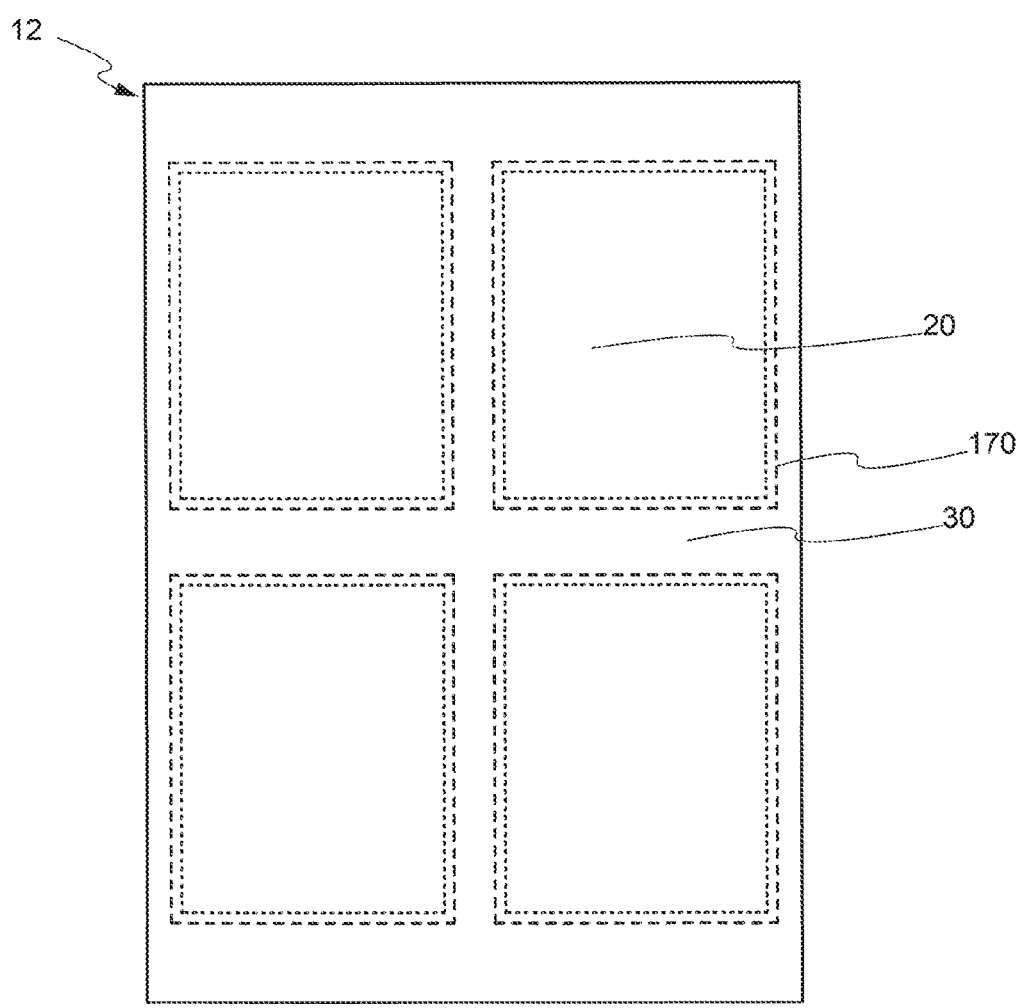
FIG. 4 is a plan view showing a structure of a protective element in an embodiment according to the present invention.

The protective element 10 may have any of various structures or shapes. For example, the protective element 10 may be provided as a protective element 11 (FIG. 3) including two adhesive regions 20. Alternatively, the protective element 10 may be provided as a protective element 12 (FIG. 4) including four adhesive regions 20. The protective element 10 may be circular or triangular.

Embodiment 2

Hereinafter, pasting of a protective element 100 to the display device 40 (may also be referred to as a "display panel") will be described. The materials, the structures and the methods described in embodiment 1 are incorporated in this embodiment.
(1. Structure of the Protective Element 10)

Figure 5:
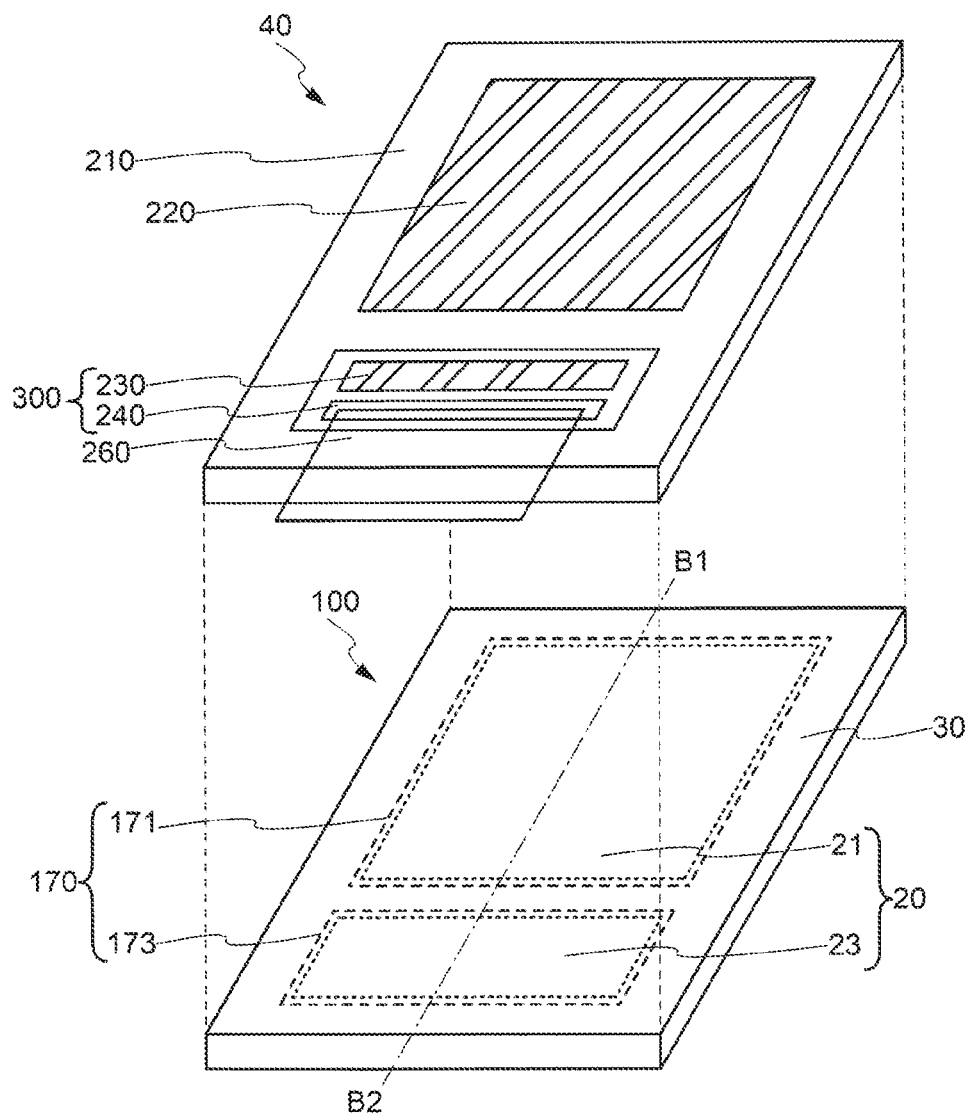
FIG. 5 is an exploded perspective view showing a protective element and a display device to which the protective element is to be pasted in an embodiment according to the present invention.

As shown in FIG. 5, the protective element 100 is pasted on a first surface (e.g., a rear surface) of the display device

40. As described below in detail, the display device 40 includes a substrate 210, and a display region 220, a peripheral region 300 including at least one of a driving circuit 230 and a terminal portion 240, and a flexible printed circuit 260 provided on the substrate 210. The substrate 210 is formed of a foldable material. The adhesive region 20 of the protective element 100 includes a first adhesive region 21 and a second adhesive region 23.

The first adhesive region 21 is pasted to a part of a rear surface of the substrate 210 that faces the display region 220 of the display device 40. Namely, the first adhesive region 21 may be considered as an adhesive surface corresponding to the display region 220 included in the substrate 210. The first adhesive region 21 is larger than the display region 220. The second adhesive region 23 is pasted to a part of the rear surface of the substrate 210 that faces the peripheral region 300 of the display device 40. Namely, the second adhesive region 23 may be considered as an adhesive surface corresponding to the peripheral region 300 included in the substrate 210. The second adhesive region 23 is larger than the peripheral region 300. The non-adhesive region 30 is provided to surround the first adhesive region 21 and the second adhesive region 23.

The cutting portion 170, more specifically, a cutting portion 171 and a cutting portion 173, are respectively provided to surround the first adhesive region 21 and the second adhesive region 23. The cutting portion 171 and the cutting portion 173 are frame-shaped. The cutting portion 171 is provided outer to an edge of the first adhesive region 21, and the cutting portion 173 is provided outer to an edge of the second adhesive region 23. The cutting portion 171 and the cutting portion 173 are provided on the non-adhesive region 30.

Figure 6:
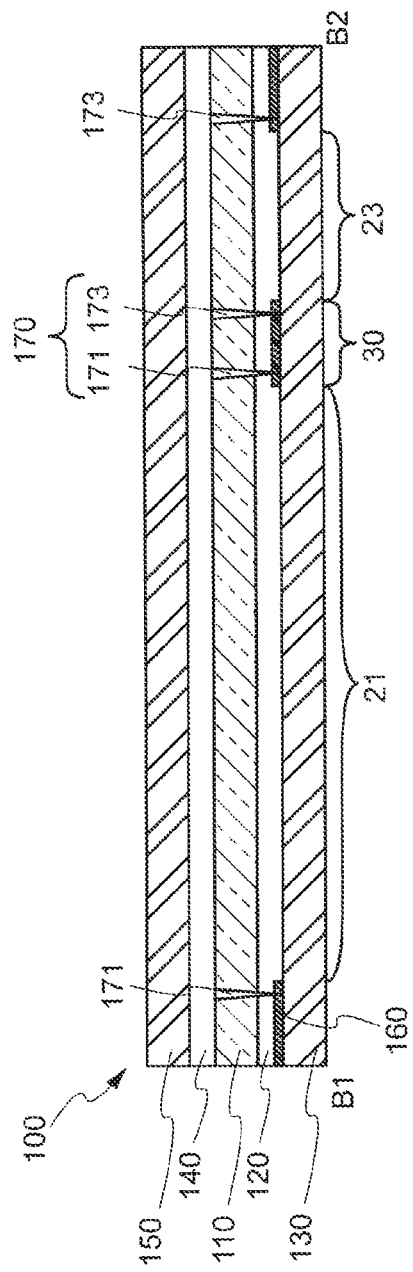
FIG. 6 is a cross-sectional view showing the structure of the protective element in an embodiment according to the present invention.

FIG. 6 is a cross-sectional view of the protective element 100 taken along line B1-B2 provided for the protective element 100 shown in FIG. 5.

As shown in FIG. 6, the protective element 100 includes the protective film 110, the first adhesive layer 120, the first release film 130, the second adhesive layer 140, the second release film 150, and the non-adhesive layer 160, like the protective element 10.

The protective film 110 is a film having a function of protecting the display device 40.

The first adhesive layer 120 is provided on the bottom surface of the protective film 110. The first adhesive layer 120 has a function of pasting the protective film 110 and the rear surface of the display device 40 (the surface on which neither the display region 220 nor the peripheral region 300 is provided) to each other.

The first release film 130 is provided on the first adhesive layer 120. The first release film 130 is provided to cover the protective film 110 while the protective film 110 is transported or processed before being pasted to the display device 40.

The second adhesive layer 140 is provided on the top surface of the protective film 110. The second adhesive layer 140 may be formed of substantially the same material as that of the first adhesive layer 120.

The second release film 150 is provided on the second adhesive layer 140. The second release film 150 may be formed of the same material as that of the first release film 130.

The non-adhesive layer 160 is provided between the first adhesive layer 120 and the first release film 130. The non-adhesive layer 160 has a function of forming the non-adhesive region 30 surrounding the first adhesive region 21 and the second adhesive region 23 shown in FIG. 5.

As shown in FIG. 6, the cutting portion 170 also shown in FIG. 5 is provided to extend from the top surface of the protective film 110 to the bottom surface of the non-adhesive layer 160.

(2. Method for Pasting the Protective Film)

Now, with reference to FIG. 7 to FIG. 11 a method for pasting the protective film 110 to the rear surface of the substrate 210 of the display device 40 will be described.

Figure 7:
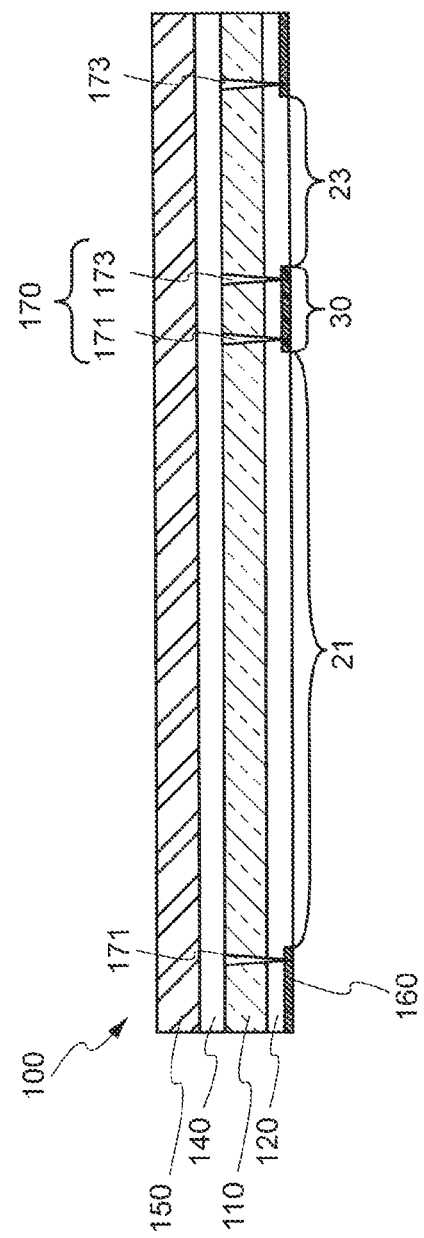
FIG. 7 is a cross-sectional view showing a method for manufacturing a display device in an embodiment according to the present invention.

First, as shown in FIG. 7, the first release film 130 of the protective element 100 is peeled off to expose the first adhesive layer 120 and the non-adhesive layer 160. The first release film 130 contains the peel agent as described above and thus is peeled off easily.

Figure 8:
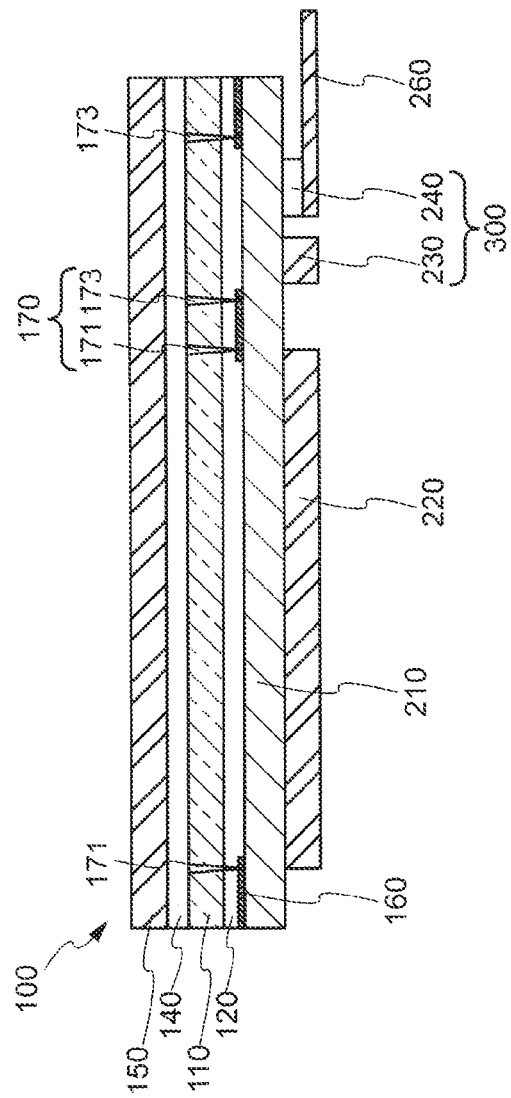
FIG. 8 is a cross-sectional view showing the method for manufacturing the display device in an embodiment according to the present invention.
Figure 9:
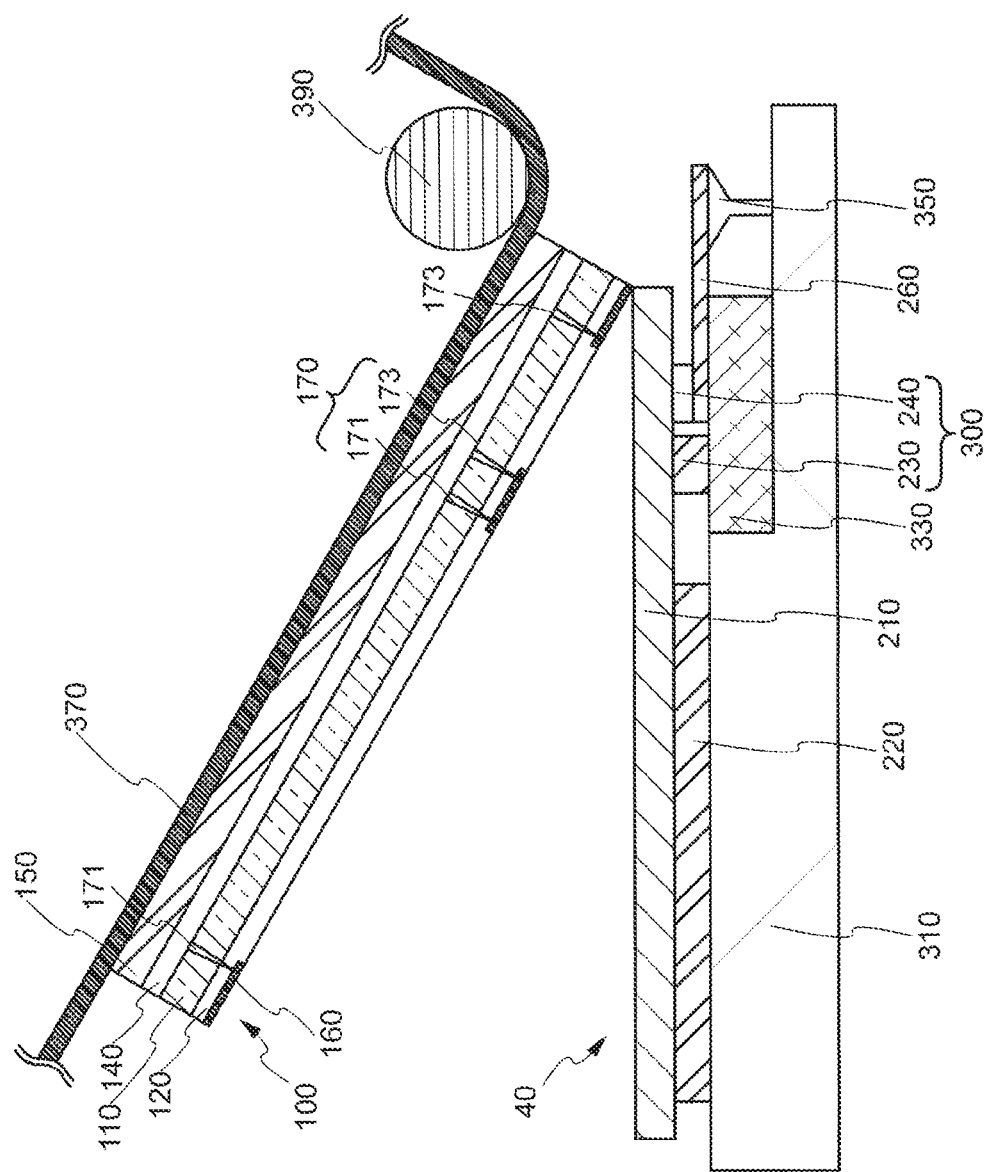
FIG. 9 is a cross-sectional view showing the method for manufacturing the display device in an embodiment according to the present invention.

Next, as shown in FIG. 8, the display device 40 and the resultant protective element 100 are pasted to each other such that the substrate 210 of the display device 40 and the first adhesive layer 120 are in contact with each other. The pasting may be performed as described below with reference to FIG. 9 and FIG. 10. The display region 220 includes, for example, an organic EL element as a display element. Before being pasted, the display device 40 is secured to a stage 310, a cushion stage 330 and a stage 350. The display device 40 may be vacuum-adsorbed or electrostatically adsorbed to the stage 310, the cushion stage 330 and the stage 350. The protective element 100 is adsorbed and secured to a belt 370. Next, as shown in FIG. 9, the protective element 100 is put into contact with an edge of the bottom surface (rear surface) of the substrate 210. Next, as shown in FIG. 10, a roller 390 is moved to progressively paste the rear surface of the substrate 210 and the protective element 100 to each other.

Figure 10:
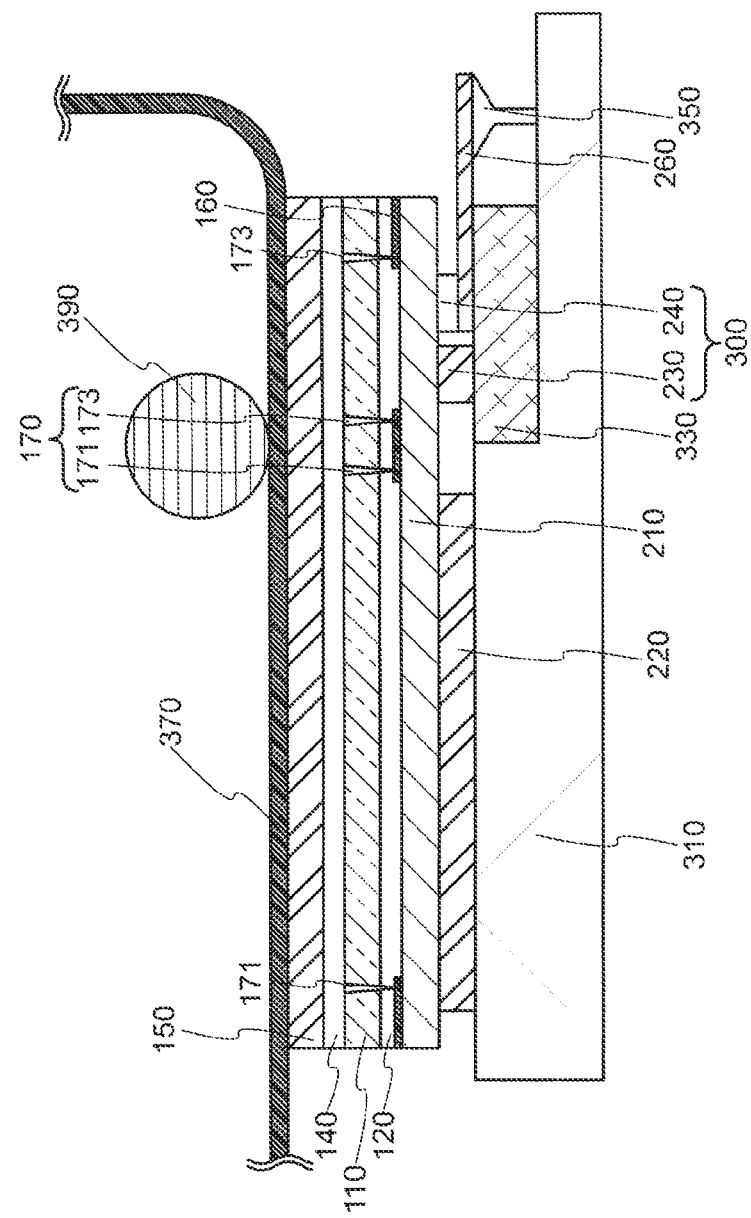
FIG. 10 is a cross-sectional view showing the method for manufacturing the display device in an embodiment according to the present invention.

As shown in FIG. 10, the protective element 100 does not have any step and is flat when being pasted to the rear surface of the substrate 210. Therefore, even though the substrate 210 is sufficiently thin to be foldable, concentration of a stress is prevented. Therefore, the lines provided on the substrate 210 are prevented from being broken.

Figure 11:
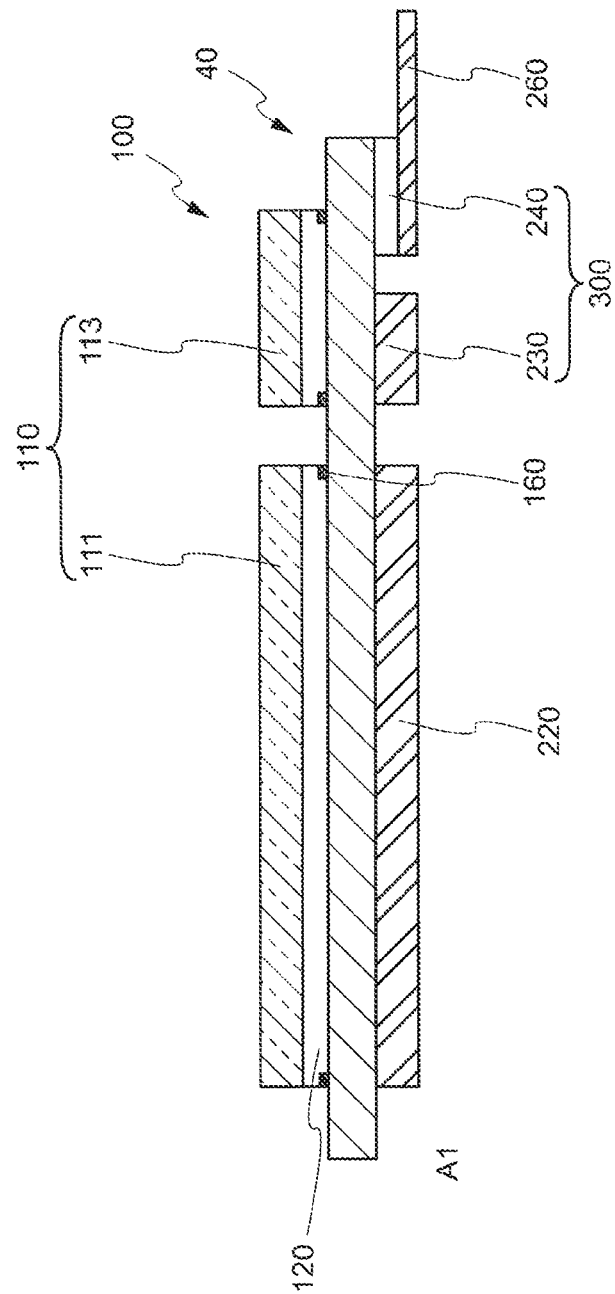
FIG. 11 is a cross-sectional view showing the method for manufacturing the display device in an embodiment according to the present invention.

Next, as shown in FIG. 11, the second adhesive layer 140 and the second release film 150 are peeled off from the protective element 100. In addition, a part of the protective film 110, a part of the first adhesive layer 120, and a part of the non-adhesive layer 160 (non-adhesive region 30) that are outer to the cutting portion 170 (e.g., parts between the cutting portion 171 and the cutting portion 173 shown in FIG. 7) are peeled off. These parts may be peeled off physically or by a chemical treatment, a thermal treatment or a light radiation. After the parts are peeled off, the remaining part of the first adhesive layer 120 may be thermally treated or irradiated with light, so that the adhesion between the protective film 110 and the substrate 210 is improved.

Figure 12:
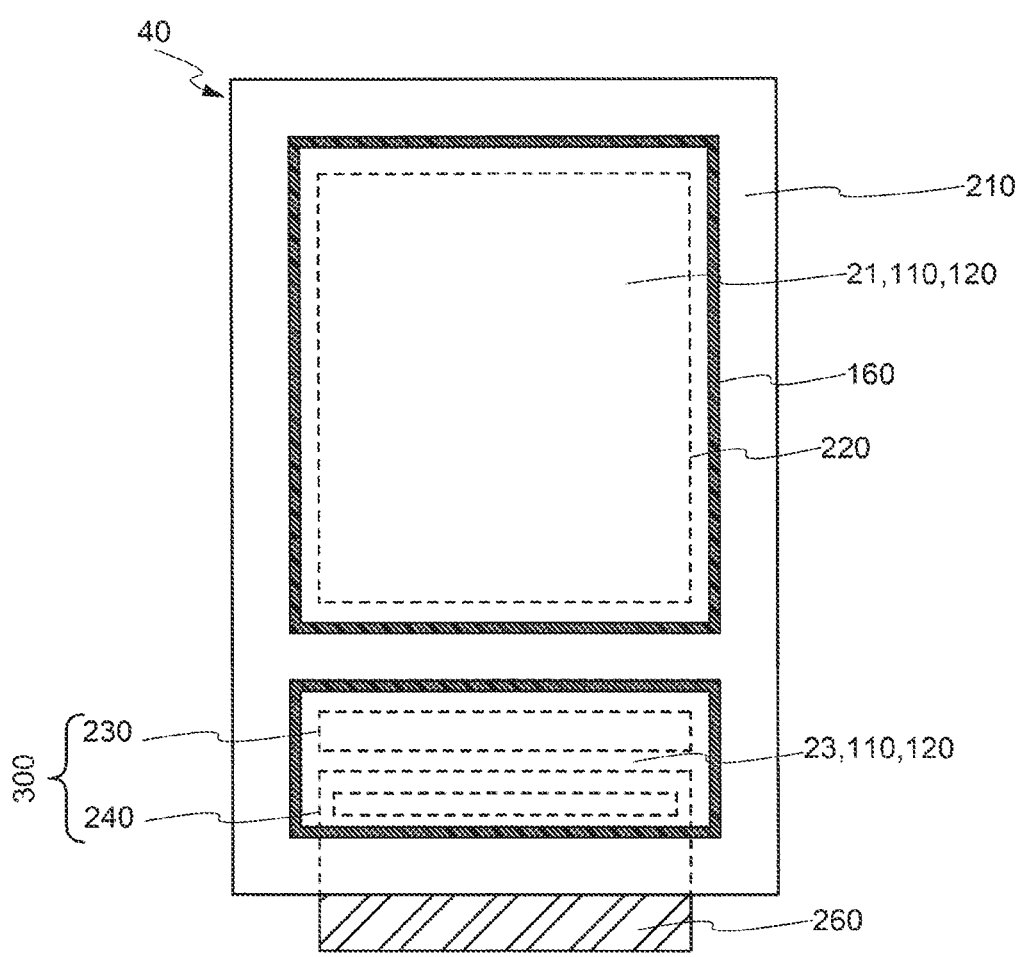
FIG. 12 is a cross-sectional view showing the structure of the display device in a state after a protective film is pasted thereto in an embodiment according to the present invention.
Figure 13:
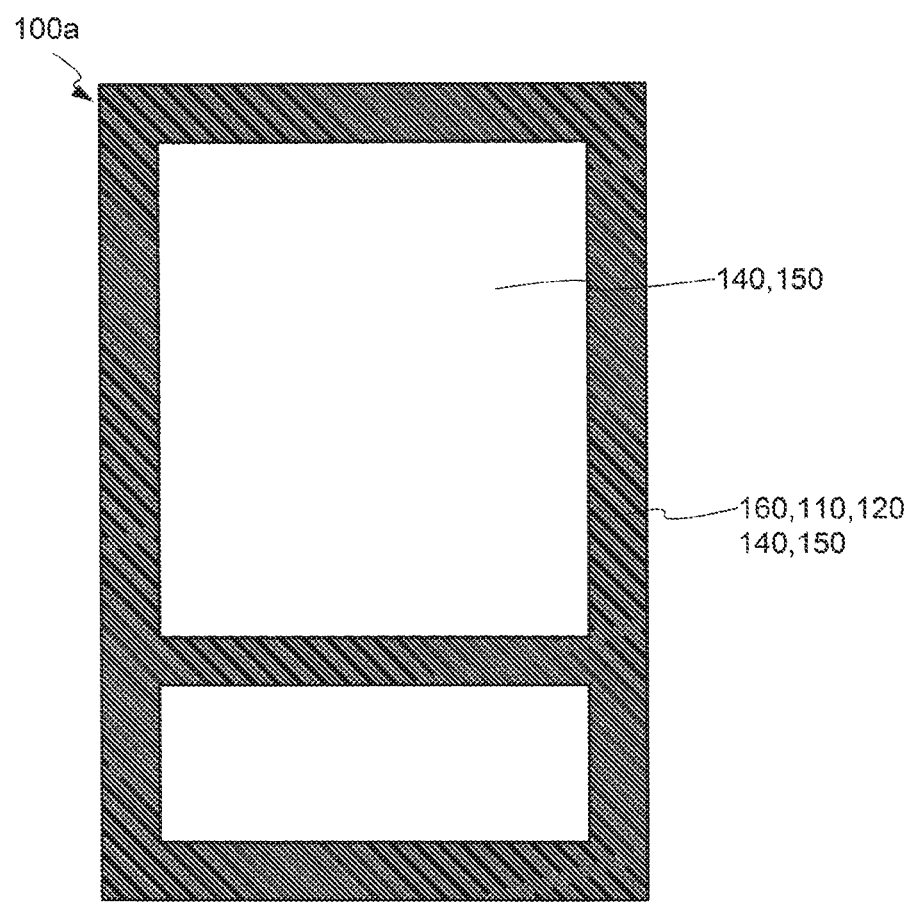
FIG. 13 is a plan view showing a part of a protective element that has been peeled off in an embodiment according to the present invention.

FIG. 12 is a plan view of the display device 40 after the above-described components are peeled off. FIG. 13 is a plan view of a protective element part 100*a*, of the protective element 100, which has been peeled off. As shown in FIG. 12, the non-adhesive layer 160 (e.g., non-adhesive layer 161; see FIG. 14) is provided to surround the first adhesive region 21 of the display device 40. The non-adhesive layer 160 (e.g., non-adhesive layer 163; see FIG. 14) is provided to surround the second adhesive region 23. Such a structure is provided because the cutting portions 171 and 173 are provided on the non-adhesive region 30, more specifically, are provided outer to the edges of the first adhesive region 21 and the second adhesive region 23 such that the above-described peeling is performed with certainty. As shown in FIG. 13, the protective element part 100*a* is peeled off from the substrate 210 except for the first adhesive region 21 and the second adhesive region 23. As a result, the protective film 110 is divided into a protective film 111 facing the display region 220 and a protective film 113 facing the peripheral region 300 as shown in FIG. 11. The protective film 110 and the protective film 113 are located to be away from each other, so that the display device 40 is easily foldable along a border between the display region 220 and the peripheral region 300.

The above-described method allows the protective film 110 to be pasted to the rear surface of the substrate 210 without breaking the lines in the display device 40. The above-described method also allows the substrate 210 of the display device 40 to be folded easily.

(3. Structure of the Display Device)

Figure 14:
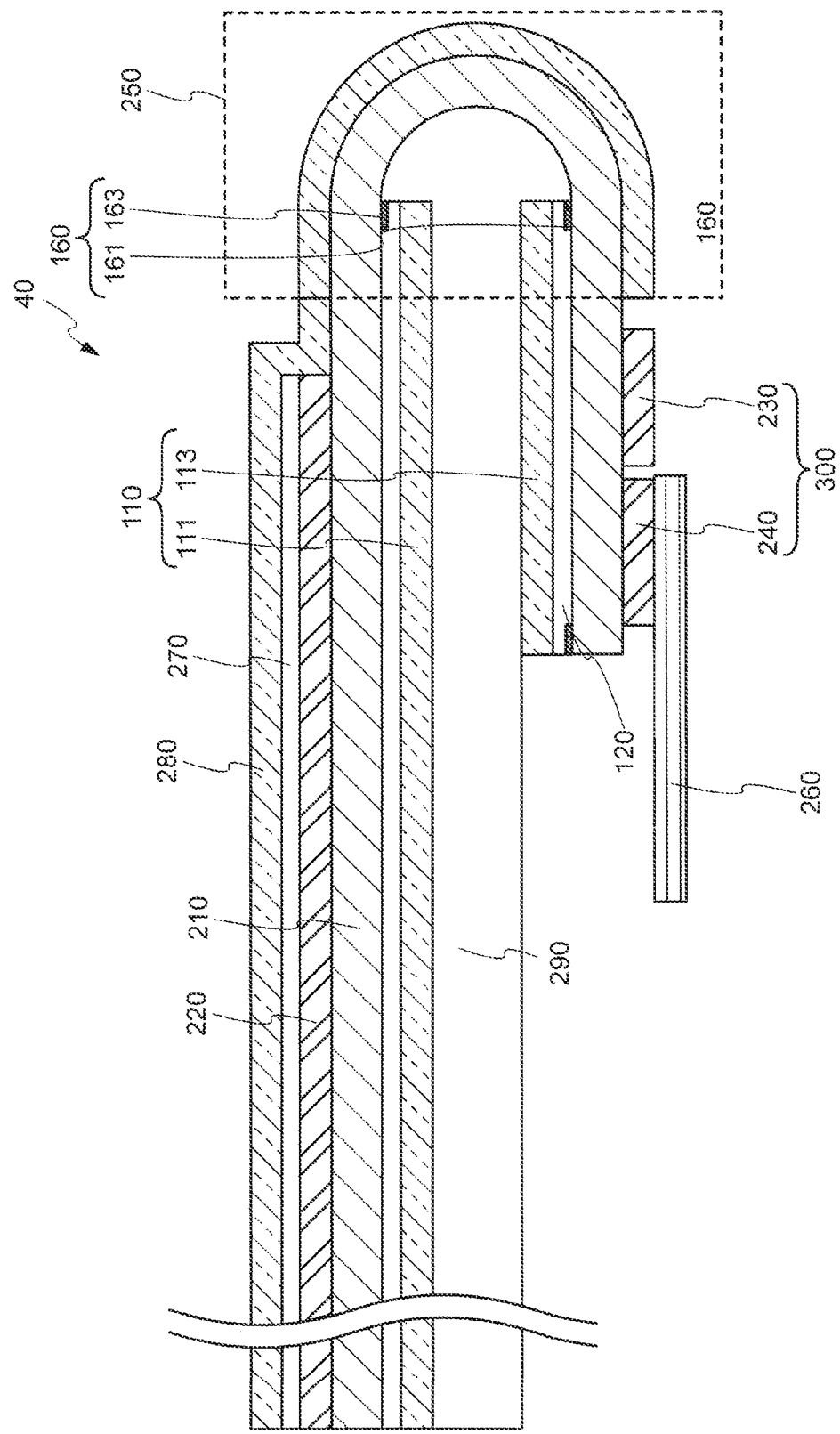
FIG. 14 is a cross-sectional view showing the structure of the display device including the protective film in an embodiment according to the present invention.

FIG. 14 shows a structure of the display device 40 in a folded state.

As shown in FIG. 14, the display device 40 includes the protective film 110, the first adhesive layer 120, the non-adhesive layer 160, the substrate 210, the display region 220, the driving circuit 230, the terminal portion 240, the flexible printed circuit 260, an adhesive layer 270, a protective layer 280, and a spacer 290. The display device 40 is folded at a foldable portion 250.

The substrate 210 may be formed of an organic resin material as a foldable material. The substrate 210 may be formed of, for example, a resin material such as a polyimide resin, an acrylic resin, an epoxy resin, a polyethylene terephthalate resin or the like. The substrate 210 is secured by the spacer 290 as being folded.

The protective film 110 is located on the bottom surface (rear surface) of the substrate 210 and is pasted to the substrate 210 via the first adhesive layer 120. The foldable portion 250 is located between the display region 220 and the peripheral region 300 including the driving circuit 230 and/or the terminal portion 240 of the display device 40. The above-described method for pasting the protective film 110 is used, so that the protective film 110 is provided as being divided into the protective film 111 and the protective film 113. The protective film 111 and the protective film 113 are located to be away from each other while having the foldable portion 250 therebetween. This alleviates interference (may be referred to as "stiffness") against folding, and the display device 40 is easily foldable at the foldable portion 250. The substrate 210 has a radius of curvature as small as 0.4 mm at the foldable portion 250.

The spacer 290 is not absolutely necessary. A heat dissipation sheet or the like may be optionally provided between the protective film 110 and the space 290. The heat dissipation sheet may be formed of a metal material such as stainless steel, copper or the like. The above-described method for pasting the protective film 110 is used, so that the non-adhesive layer 160 (non-adhesive layers 161 and 163) is provided between the substrate 210 and the first adhesive layer 120.

The protective layer 280 is provided on the display region 220. The protective layer 280 has a function of protecting the display region 220. The protective layer 280 may be formed of substantially the same material as that of the protective film 110 or may be formed of a different material from the material used for the protective film 110. The protective layer 280 may be film-like, resin-like, or optionally, a combination of a film-like element and a resin-like element. The protective layer 280 provided on the display region 220 may be colorless and transparent. A polarization plate may be optionally provided on the protective layer 280.

The driving circuit 230 includes one or more of a driving circuit (gate driver) for driving a scanning line and a driving circuit (source driver) for driving a signal line. The driving circuit 230 outputs a signal to transistors in the display region 220. The driving circuit 230 is formed by an integrated circuit such as an ASIC (Application Specific Integrated Circuit) or the like.

The flexible printed circuit 260 may receive a signal from an external circuit and transmit the signal to the driving circuit 230. The flexible printed circuit 260 includes a plurality of lines located on a flexible resin substrate, and is electrically connected with the terminal portion 240 provided on the substrate 210. The driving circuit 230 may be located on the flexible printed circuit 260.

The display region 220 includes pixels located in an array. In the case where the display device 40 is of an active matrix type, a thin film transistor and a display element are provided in each of the pixels. The thin film transistor drives the display element based on an external signal from the flexible printed circuit 260 or a signal from the driving circuit 230, and displays a still image or a moving image. The display element may be, for example, organic EL elements. The display region 220 is electrically connected with the driving circuit 230 and the flexible printed circuit 260 via the lines provided on the substrate 210. Since the above-described method for pasting the protective film 110 is used, the lines are not broken or damaged in any other manner, and thus a display failure or the like is suppressed.

In the case where display device 40 having the above-described structure is seen in the cross-sectional view in FIG. 14, the driving circuit 230 and the flexible printed circuit 260 are located on a rear side of the display region 220. Namely, the above-described structure, in which an end portion of the substrate 210 is folded up, the display device 40 is decreased in size.

Embodiment 3

A protective element 1100 having a different structure from that of the protective element 100 will be described with reference to FIG. 15 and FIG. 16. Substantially the same components and substantially the same steps as those in embodiment 1 and embodiment 2 will not be described again, and the descriptions thereof in embodiment 1 and embodiment 2 will be incorporated by reference when necessary.

Figure 15:
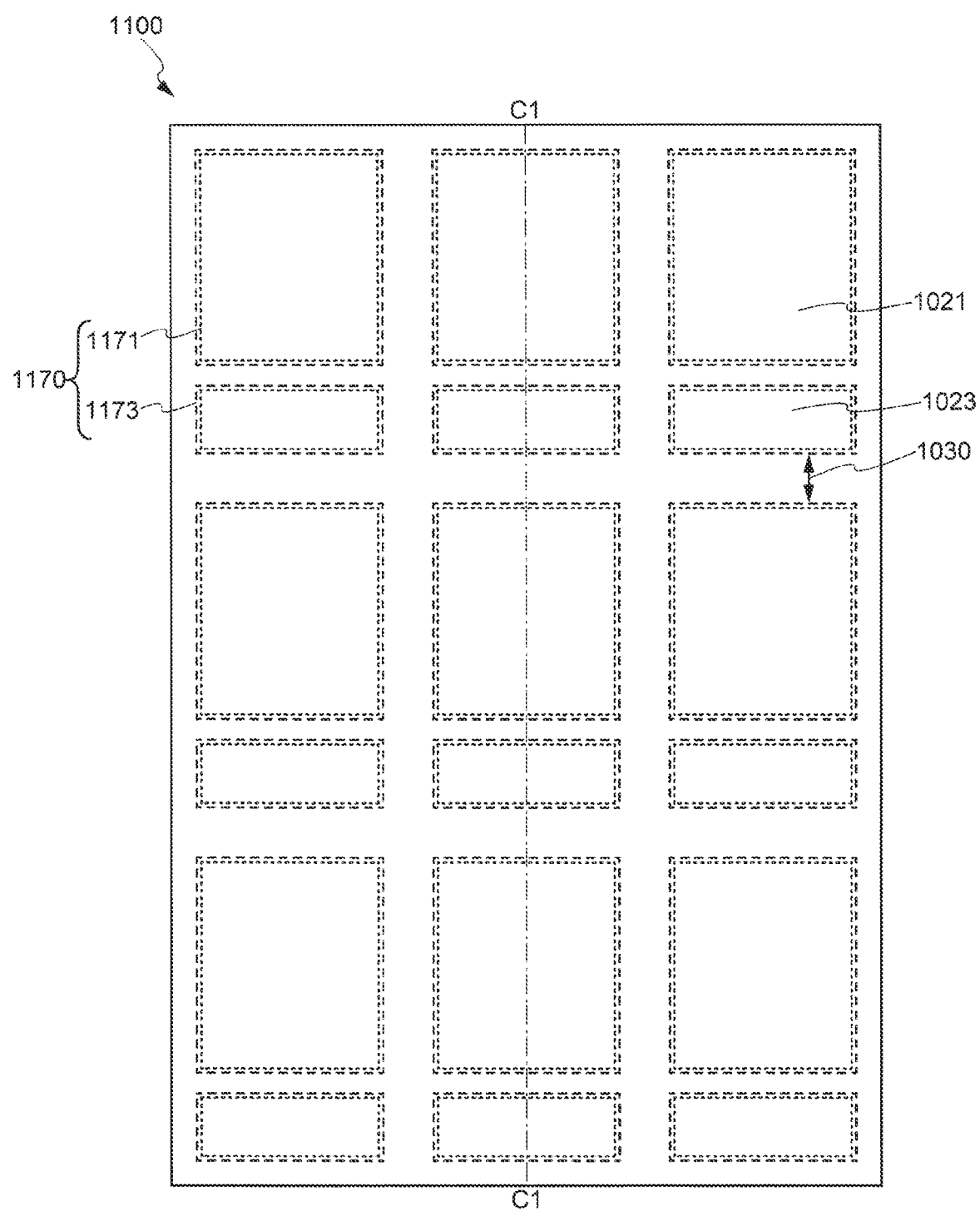
FIG. 15 is a plan view showing a structure of a protective element in an embodiment according to the present invention.
Figure 16:
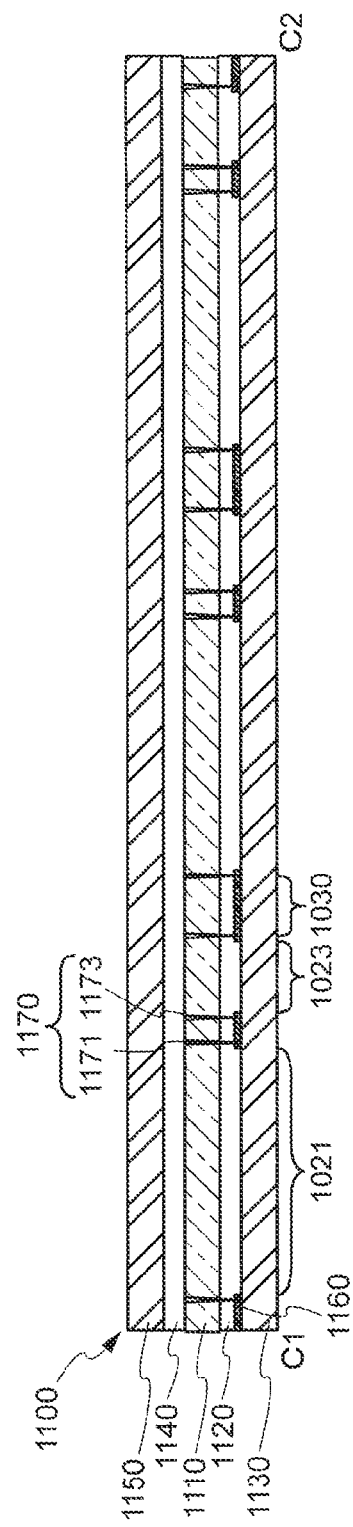
FIG. 16 is a cross-sectional view showing the structure of the protective element in an embodiment according to the present invention.

FIG. 15 is a plan view of the protective element 1100. FIG. 16 is a cross-sectional view of the protective element 1100 taken along line C1-C2 provided for the protective element 1100 shown in FIG. 15.

As shown in FIG. 15, the protective element 1100 includes a plurality of first adhesive regions 1021, a plurality of second adhesive regions 1023, a non-adhesive region 1030, and cutting portions 1170 (cutting portions 1171 and 1173). As shown in FIG. 16, the protective element 1100 includes a protective film 1110, a first adhesive layer 1120, a first release film 1130, a second adhesive layer 1140, a second release film 1150, a non-adhesive layer 1160, and the cutting portions 1170. Unlike the protective element 100 described in embodiment 2, the protective element 1100 includes the plurality of first adhesive regions 1021 and the plurality of second adhesive regions 1023.

Use of the protective element 1100 allows the protective film 1110 to be pasted to a plurality of display devices 1040. In this case, the display devices 1040 may be divided into individual display devices before the protective film 1110 is pasted thereto. Alternatively, the protective film 1110 may be pasted to a large scale substrate having a plurality of display regions thereon that have not been divided yet. The protective element 1100 may be optionally cut. In this case, the post-cutting protective element 1100 may be substantially the same as the protective element 100 in embodiment 2.

In the above-described embodiments, the present invention is applied to an organic EL display device as an example. The present invention is also applicable to a liquid crystal display device, any other self-light emitting display device, an electronic paper-type display device including an electrophoretic display element or the like, or any other flat panel display device.

A person of ordinary skill in the art would readily conceive various alterations or modifications of the present invention, and such alterations and modifications are construed as being encompassed in the scope of the present invention. For example, the display devices in the above-described embodiments may have an element added thereto, or deleted therefrom, or may be changed in design optionally by a person of ordinary skill in the art. The methods in the above-described embodiments may have a step added thereto, or deleted therefrom, or may be changed in the condition optionally by a person of ordinary skill in the art. Such devices and methods are encompassed in the scope of the present invention as long as including the gist of the present invention.

In the above-described embodiments, the display device 40 includes the non-adhesive layer 160. The non-adhesive layer 160 is not absolutely necessary.

What is claimed is:

1. A protective element, comprising:
    a protective film including a first surface and a second surface opposite to the first surface;
    a first adhesive layer including an adhesive region on the first surface of the protective film;
    a first release film on the first adhesive layer;
    a second adhesive layer on the second surface of the protective film;
    a second release film on the second adhesive layer;
    a non-adhesive region located to surround the adhesive region, the nonadhesive region including a non-adhesive layer located between the first adhesive layer and the first release film; and
    a cutting portion located in the non-adhesive region and, as seen in a cross-sectional view, extending from a top surface of the protective film to a bottom surface of the non-adhesive layer.

2. The protective element according to claim 1, wherein the adhesive region includes a first adhesive region and a second adhesive region,
    the first adhesive region is an adhesive surface corresponding to a display region on a substrate, and
    the second adhesive region is an adhesive surface corresponding to a peripheral region on the substrate, the peripheral region including at least one of a terminal portion and a driving circuit.

3. The protective element according to claim 2, wherein the first adhesive region is larger than the display region, and
    the second adhesive region is larger than the peripheral region.

4. The protective element according to claim 3, wherein the non-adhesive layer is formed of varnish or medium ink.

5. A method for manufacturing a display device, the method comprising:
    peeling the first release film of the protective element according to claim 3 to expose the first adhesive layer and the non-adhesive layer;
    pasting a first surface of the substrate and the first adhesive layer of the protective element to each other; and
    peeling the second adhesive layer, the second release film, and a part of the non-adhesive layer, a part of the first adhesive layer and a part of the protective film, the parts being outer to the cutting portion.

6. The method for manufacturing a display device according to claim 5, wherein the substrate is foldable.

7. The method for manufacturing a display device according to claim 5, wherein the display region includes organic EL elements.

* * * * *